United States Patent
Behzad

(10) Patent No.: US 7,200,370 B2
(45) Date of Patent: Apr. 3, 2007

(54) POWER AMPLIFIER HAVING ENHANCED SWING CASCODE ARCHITECTURE

(75) Inventor: Arya Reza Behzad, Poway, CA (US)

(73) Assignee: Broadcom Corporation, Irvine, CA (US)

( * ) Notice: Subject to any disclaimer, the term of this patent is extended or adjusted under 35 U.S.C. 154(b) by 412 days.

(21) Appl. No.: 10/800,237

(22) Filed: Mar. 12, 2004

(65) Prior Publication Data

US 2005/0079836 A1 Apr. 14, 2005

Related U.S. Application Data

(60) Provisional application No. 60/510,827, filed on Oct. 14, 2003.

(51) Int. Cl.
*H01Q 11/12* (2006.01)
*H04B 1/04* (2006.01)
*H04B 1/06* (2006.01)

(52) U.S. Cl. ............................... 455/127.1; 455/194.2; 455/253.2

(58) Field of Classification Search ............. 455/127.1, 455/115.1, 422.1, 423, 311, 333, 194.2, 127.2, 455/127.3, 341, 253.2; 330/252, 253, 254, 330/255, 311
See application file for complete search history.

(56) References Cited

U.S. PATENT DOCUMENTS 5,999,804 A * 12/1999 Forgues .................. 455/333
6,232,848 B1 * 5/2001 Manku ..................... 333/24 R
6,724,235 B2 * 4/2004 Costa et al. ................ 327/378
2004/0183599 A1 * 9/2004 Banba et al. ............... 330/254
2004/0246056 A1 * 12/2004 Behzad et al. ............. 330/311
2005/0077967 A1 * 4/2005 Behzad et al. ............. 330/311
2005/0085205 A1 * 4/2005 Behzad .................... 455/226.1
2005/0088262 A1 * 4/2005 Behzad ....................... 334/55
2005/0088263 A1 * 4/2005 Behzad ....................... 334/56
2005/0090209 A1 * 4/2005 Behzad .................... 455/115.1
2006/0028280 A1 * 2/2006 Behzad ....................... 330/311

OTHER PUBLICATIONS

B. Ray, T. Manku, R.D. Beards, J.J.Nisbet, and W. Kung, RF Technology Group, Department of Electrical & Computer Engineering, University of Waterloo, Waterloo, Ontario Canado N2L 3G1 "A Highly Linear Bipolar IV Folded Cascode 1.9GHz Low Noise Amplifier".
Ian M. Wiles, IPR Technology, Basingstoke, Hants, UK "Cascode Circuit Works From 1V Supply"—2119 EDN-Electrical Design News, 37 May 21, 1992 No. 11, Newton, MA, US (p. 178).

* cited by examiner

*Primary Examiner*—Sonny Trinh
(74) *Attorney, Agent, or Firm*—Garlick Harrison & Markison; Bruce E. Garlick

(57) ABSTRACT

A Radio Frequency (RF) power amplifier includes a transconductance stage, an AC coupling element, and a cascode stage. The transconductance stage is adapted to receive an input RF voltage signal and to produce an output RF current signal. The cascode stage is adapted to receive an input RF current signal and to produce an output RF voltage signal. The AC coupling element couples between the transconductance stage and the cascode stage and is operable to AC couple the output RF current signal of the transconductance stage as the input RF current signal of the cascode stage.

12 Claims, 5 Drawing Sheets

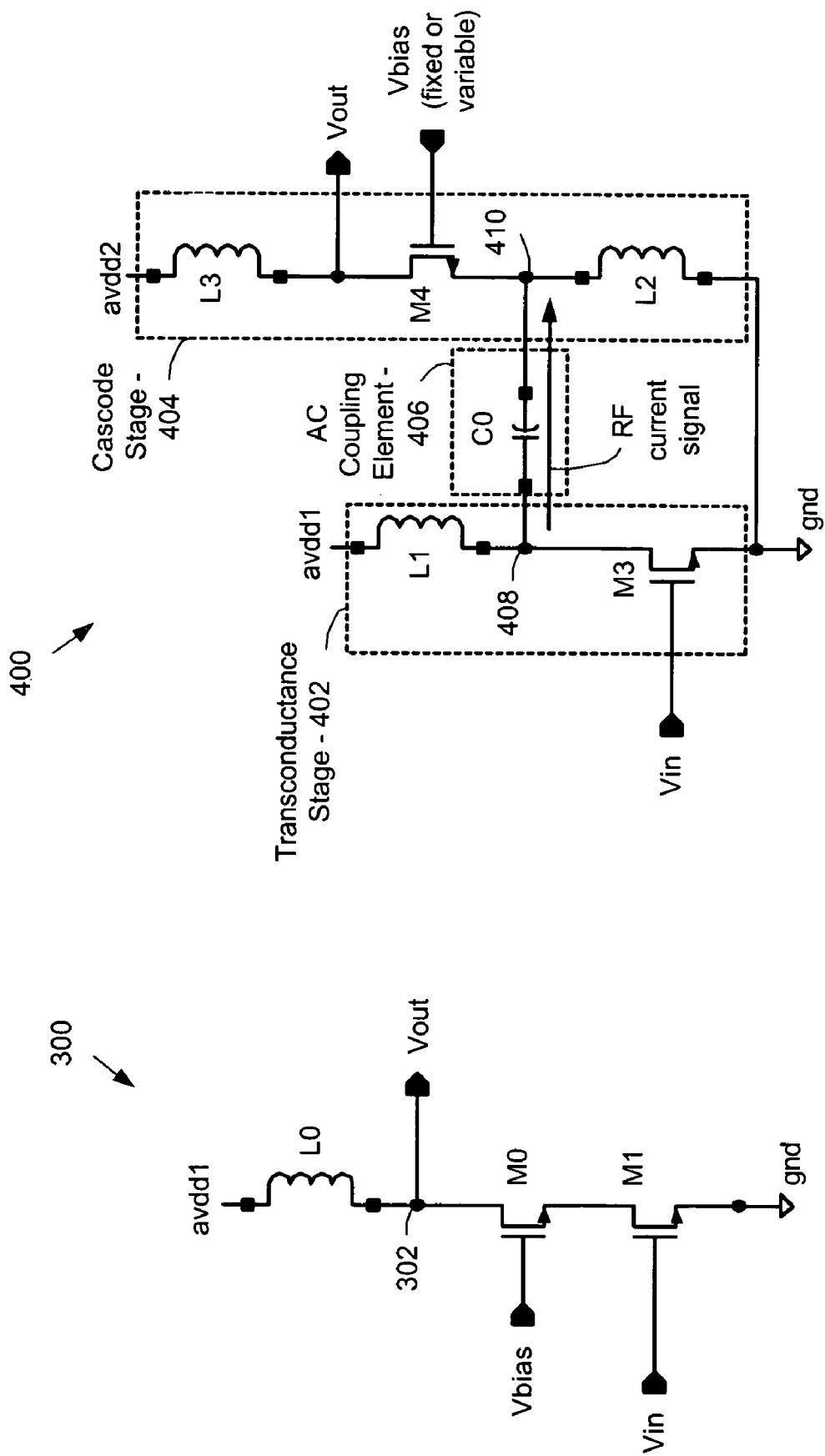

POWER AMPLIFIER HAVING ENHANCED SWING CASCODE ARCHITECTURE

CROSS REFERENCE TO RELATED APPLICATION

This application claims priority to U.S. Provisional Patent Application Ser. No. 60/510,827, filed Oct. 14, 2003, which is incorporated herein by reference for all purposes.

BACKGROUND

1. Technical Field

This invention relates generally to wireless communication systems and more particularly to radio frequency integrated circuits used in such wireless communication systems.

2. Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier. The data modulation stage converts raw data into baseband signals in accordance with the particular wireless communication standard. The one or more intermediate frequency stages mix the baseband signals with one or more local oscillations to produce RF signals. The power amplifier amplifies the RF signals prior to transmission via an antenna.

The power amplifier is often required to provide a high swing at its output. The power amplifier must also be very linear in its operation and also use as little power as possible. These competing goals are very difficult to meet, particularly in portable devices that are battery powered and that operate at relatively low voltages.

BRIEF SUMMARY OF THE INVENTION

A Radio Frequency (RF) power amplifier constructed according to the present invention overcomes these and other shortcomings of the prior art devices and includes a transconductance stage, an AC coupling element, and a cascode stage. The transconductance stage is adapted to receive an input RF voltage signal and to produce an output RF current signal. The cascode stage is adapted to receive an input RF current signal and to produce an output RF voltage signal. The AC coupling element couples between the transconductance stage and the cascode stage and is operable to AC couple the output RF current signal of the transconductance stage as the input RF current signal of the cascode stage. In operation, the output RF voltage signal may be amplified with respect to the input RF voltage signal.

In one particular embodiment, the transconductance stage includes a linear transconductance element and a biasing element, a series combination of which couples between a transconductance stage voltage supply and a ground. The linear transconductance element may be a transistor while the biasing element may be an inductor. The transistor may be one of a metal oxide silicon transistor, a field effect transistor, and a bipolar junction transistor.

In another particular embodiment, the cascode stage includes a first circuit element, a transistor, and a second circuit element, a series combination of which couples between a cascode stage voltage supply and a ground. A gate of the transistor is adapted to receive either a controllable cascode bias voltage or a fixed cascode bias voltage. With the particular embodiment of the cascode stage, the first cascode biasing element is a first inductor while the second cascode biasing element is a second inductor. The transistor may be one of a metal oxide silicon transistor, a field effect transistor, and a bipolar junction transistor. With this particular structure, the output RF voltage signal has an operational range extending from less than the ground to greater than the cascode stage voltage supply.

Other features and advantages of the present invention will become apparent from the following detailed description of the invention made with reference to the accompanying drawings.

BRIEF DESCRIPTION OF THE DRAWINGS

FIG. 3 is a schematic diagram illustrating a singled ended cascode RF power amplifier;

FIG. 4 is a schematic diagram illustrating a single ended cascode RF power amplifier constructed according to the present invention;

DETAILED DESCRIPTION OF THE DRAWINGS

Figure 1:
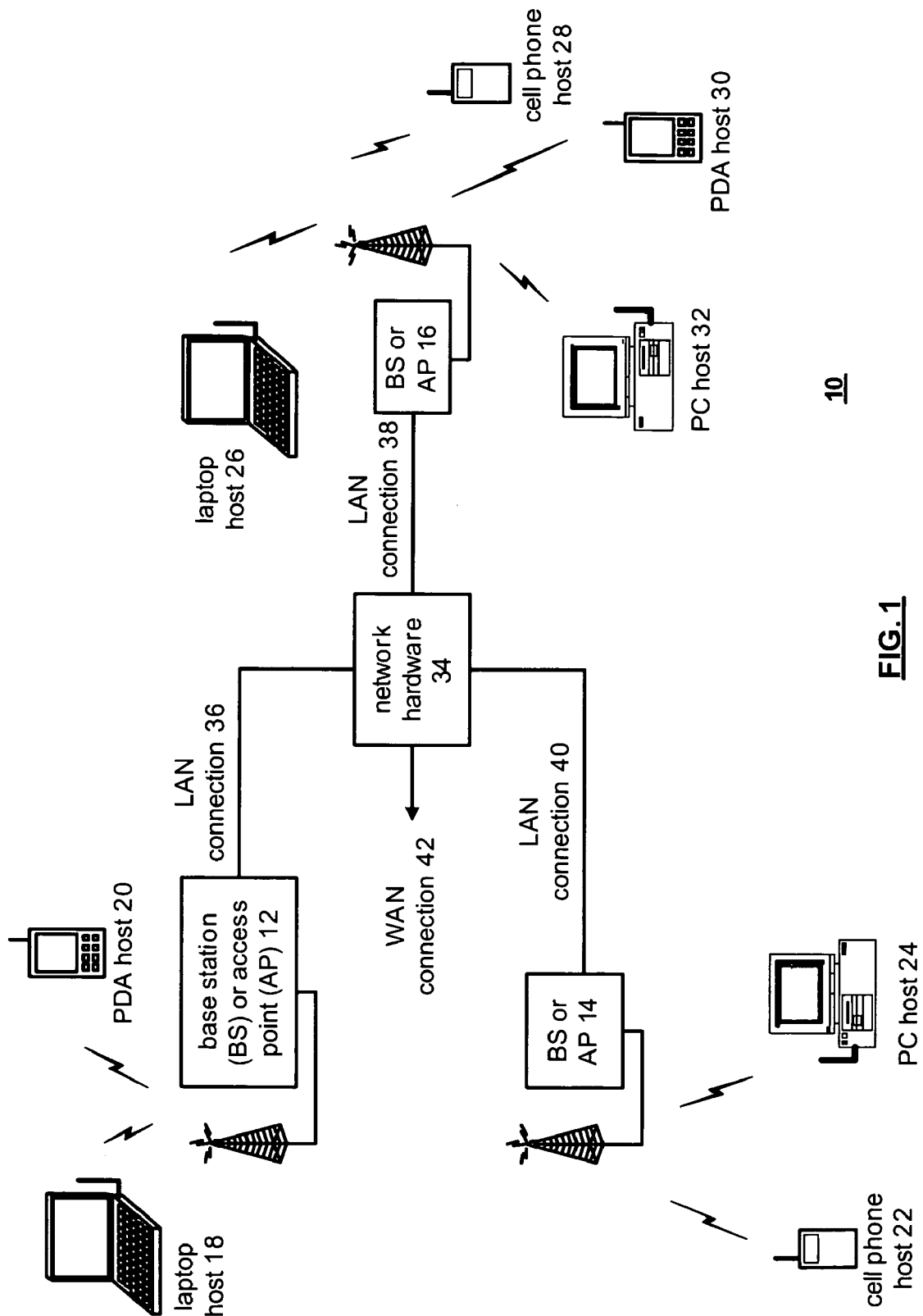
FIG. 1 is a schematic block diagram illustrating a wireless communication system in accordance with the present invention.

FIG. 1 is a schematic block diagram illustrating a communication system 10 that includes a plurality of base stations and/or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32, cellular telephone hosts 22 and 28, and/or any other type of device that supports wireless communications. The details of the wireless communication devices will be described with reference to FIG. 2.

The base stations or access points 12–16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12–16 has an associated antenna or antenna array to communicate with the wireless communication devices in its area. Typically, the wireless communication devices register with a particular base station or access point 12–14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifiers and/or programmable multi-stage amplifiers as disclosed herein to enhance performance, reduce costs, reduce size, and/or enhance broadband applications.

Figure 2:
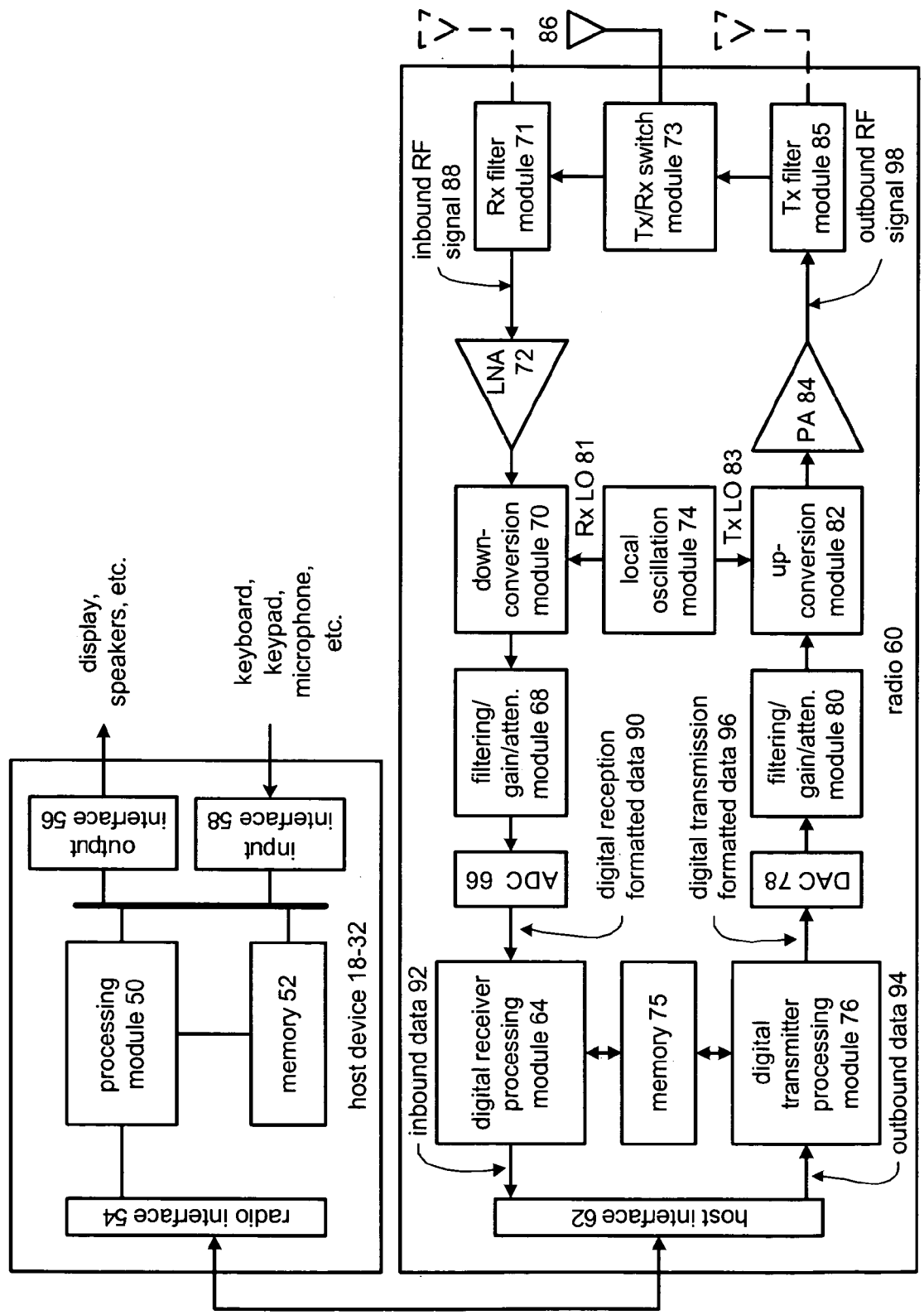
FIG. 2 is a schematic block diagram illustrating a wireless communication device in accordance with the present invention.

FIG. 2 is a schematic block diagram illustrating a wireless communication device that includes the host device 18–32 and an associated radio 60. For cellular telephone hosts, the radio 60 is a built-in component. For personal digital assistants hosts, laptop hosts, and/or personal computer hosts, the radio 60 may be built-in or may be an externally coupled component that couples to the host device 18–32 via a communication link, e.g., PCI interface, PCMCIA interface, USB interface, or another type of interface.

As illustrated, the host device 18–32 includes a processing module 50, memory 52, radio interface 54, input interface 58, and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera, such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, a filtering/gain/attenuation module 68, an IF mixing down conversion stage 70, a receiver filter 71, a low noise amplifier 72, a transmitter/receiver switch 73, a local oscillation module 74, memory 75, a digital transmitter processing module 76, a digital-to-analog converter 78, a filtering/gain/attenuation module 80, an IF mixing up conversion stage 82, a power amplifier 84, a transmitter filter module 85, and an antenna 86. The antenna 86 may be a single antenna that is shared by the transmit and receive paths as regulated by the Tx/Rx switch 77, or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory 75 stores, and the processing module 64 and/or 76 executes, operational instructions that facilitate functionality of the device. In some embodiments, the combination of the digital receiver processing module, the digital transmitter processing module, and the memory 75 may be referred to together as a "baseband processor."

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE802.11a, IEEE802.11b, IEEE802.11g, Bluetooth, et cetera) to produce digital transmission formatted data 96. The digital transmission formatted data 96 will be a digital base-band signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain/attenuation module 80 filters and/or adjusts the gain of the analog signal prior to providing it to the IF mixing stage 82. The IF mixing stage 82 directly converts the analog baseband or low IF signal into an RF signal based on a transmitter local oscillation 83 provided by local oscillation module 74. The power amplifier 84 amplifies the RF signal to produce outbound RF signal 98, which is filtered by the transmitter filter module 85. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch 77, where the Rx filter 71 bandpass filters the inbound RF signal 88. The Rx filter 71 provides the filtered RF signal to low noise amplifier 72, which amplifies the signal 88 to produce an amplified inbound RF signal. The low noise amplifier 72 provides the amplified inbound RF signal to the IF mixing module 70, which directly converts the amplified inbound RF signal into an inbound low IF signal or baseband signal based on a receiver local oscillation 81 provided by local oscillation module 74. The down conversion module 70 provides the inbound low IF signal or baseband signal to the filtering/gain/attenuation module 68. The filtering/gain/attenuation module 68 may be implemented in accordance with the teachings of the present invention to filter and/or attenuate the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18–32 via the radio interface 54.

As one of average skill in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

FIG. 3 is a schematic diagram illustrating a singled ended cascode power amplifier 300. The single ended cascode power amplifier 300 includes a transconductance stage having a transistor M1 that receives an input voltage signal and produces a current signal through the transistor M1. Transistor M1 is biased in its active range by inductor L0 and the voltage drop across cascode transistor M0. The cascode transistor M0 is biased by the $V_{bc}$ voltage level to control the impedance at node 302. An output voltage at node 302 is a product of the current that passes through transistors M1 and M0 and the impedance at node 302.

Cascode amplifiers provide various advantages when used as power amplifiers in a transmitter, e.g., RF Power Amplifier 84 of FIG. 2, a power amplifier of a wired communication device, etc. One advantage to using a cascode amplifier as a power amplifier is so that a relatively high voltage supply avdd1 may be employed in combination with a fine-geometry, low-voltage, high-Gm device, i.e., transistor M1. In the configuration of FIG. 3, the cascode device M0 tolerates the high voltage swing at the node 302, and the low-voltage M1 transistor provides the transconductance or gain. In this way, the large Gm for a given bias current can be achieved and a large swing can be tolerated without damage to the low voltage device M1 transistor. The cascode transistor M0 also assist in reducing the Miller effect experienced by the transconductance transistor M1.

The cascode configuration provides additional benefits as well. The cascode power amplifier 300 provides excellent input/output isolation to reduce or eliminate oscillations between the input side of the amplifier and the output side of the amplifier. Such isolation assists in facilitating proper tuning of the amplifier as well as circuits on the input side and the output side of the amplifier.

The cascode power amplifier 300 of FIG. 3, however does not allow for maximum possible headroom. "$V_{bc}$" has to be tied to a bias line in such a way that transistor M1 has sufficient $V_{ds}$ drop so that it may provide reasonably high Gm and reasonably high output impedance ($R_o$). Further, $V_{bc}$ must be low enough so that the cascode device M0 has enough $V_{ds}$ drop so that it does not suffer from low and signal dependent output impedance and a resulting loss of gain and linearity.

FIG. 4 is a schematic diagram illustrating a single ended cascode power amplifier 400 constructed according to the present invention. The power amplifier includes a transconductance stage 402, a cascode stage 404, and an AC coupling element 406. The transconductance stage 402 receives an input voltage signal ($V_{in}$) and produces an output current signal. The transconductance stage 402 comprises a series combination of a linear transconductance element M3 and a circuit element L1 coupled between a transconductance stage voltage supply avdd1 and a ground. In the embodiment of FIG. 4, the linear transconductance element M3 comprises a transistor and the circuit element comprises an inductor L1. A first terminal of the inductor L1 couples to the transconductance stage voltage supply avdd1, a second terminal of the inductor couples to a drain of the transistor M3, a source of the transistor couples to a ground, and the input voltage signal Vin couples to a gate of the transistor M3. Thus, the inductor L1 is in series with the source and drain terminals of the transistor M3. The transistor M3 may be one of a metal oxide silicon field effect (MOSFET) transistor, a field effect transistor, and a bipolar junction transistor, and is a MOSFET in the illustrated embodiment.

The AC coupling element 406 couples between the transconductance stage 402 and the cascode stage 404 and AC couples the output current signal of the transconductance stage 402 produced at node 408 as the input current signal of the cascode stage 404 at node 410. In the illustrated embodiment, the AC coupling element 406 is a capacitor.

The cascode stage 404 is adapted to receive an input current signal at node 410 and to produce an output voltage signal Vout. In the illustrated embodiment, the cascode stage includes a series combination of a first circuit element (inductor L3), source and drain terminals of a transistor M4, and a second circuit element (inductor L2), the series combination biased between a cascode stage voltage supply avdd2 and a ground. A gate of the transistor M4 is adapted to receive a controllable cascode bias voltage $V_{bc}$. As will be described further with reference to FIGS. 6 and 7, in some embodiments, $V_{bc}$ is varied depending upon the operating conditions of the transmitter serviced by the power amplifier 400. In other embodiments, $V_{bc}$ is fixed.

In operation, Vout has an operational range extending from less than ground to greater than the cascode stage voltage supply avdd2. The transconductance stage 402 and the cascode stage 404 may be powered at differing voltage supply levels, e.g., avdd2 <>avdd1, or may be powered at a common voltage supply level, e.g., avdd2=avdd1.

With the cascode amplifier 400 of FIG. 4, the transconductance stage 402 is effectively decoupled from the cascode stage 404 by the AC coupling element 406 (capacitor C0) and inductors L1 and L2. Inductors L1 and L2 may be large enough to act as a choke or, alternately, may be chosen to resonate out load capacitances at their respective nodes. Either way the signal current flows through the C0 cap and through M4 and to the load inductor L3. With this scheme, not only can the output voltage Vout swing above cascode stage voltage supply avdd2, but also the source of the M4 cascode device can swing below ground (gnd) providing a very large possible swing across the M4 device. Since M3 is a low voltage device, it can be fed from the lower voltage supply avdd1 (e.g. 1.8 V) while the cascode stage 404 can be fed from a higher voltage supply avdd2 (e.g. 3.3 V) for maximum possible swing.

For power amplifiers, maximum swing is desirable. Lower swing can typically be tolerated if high-ratio impedance transformers are used but such transformers are typically either not available at frequencies or lossy. The power consumption of the circuit of FIG. 4 is more than that of FIG. 3 for the same gain level. However, the circuit of FIG. 4 produces output power levels that cannot be achieved by the circuit of FIG. 3.

Figure 5:
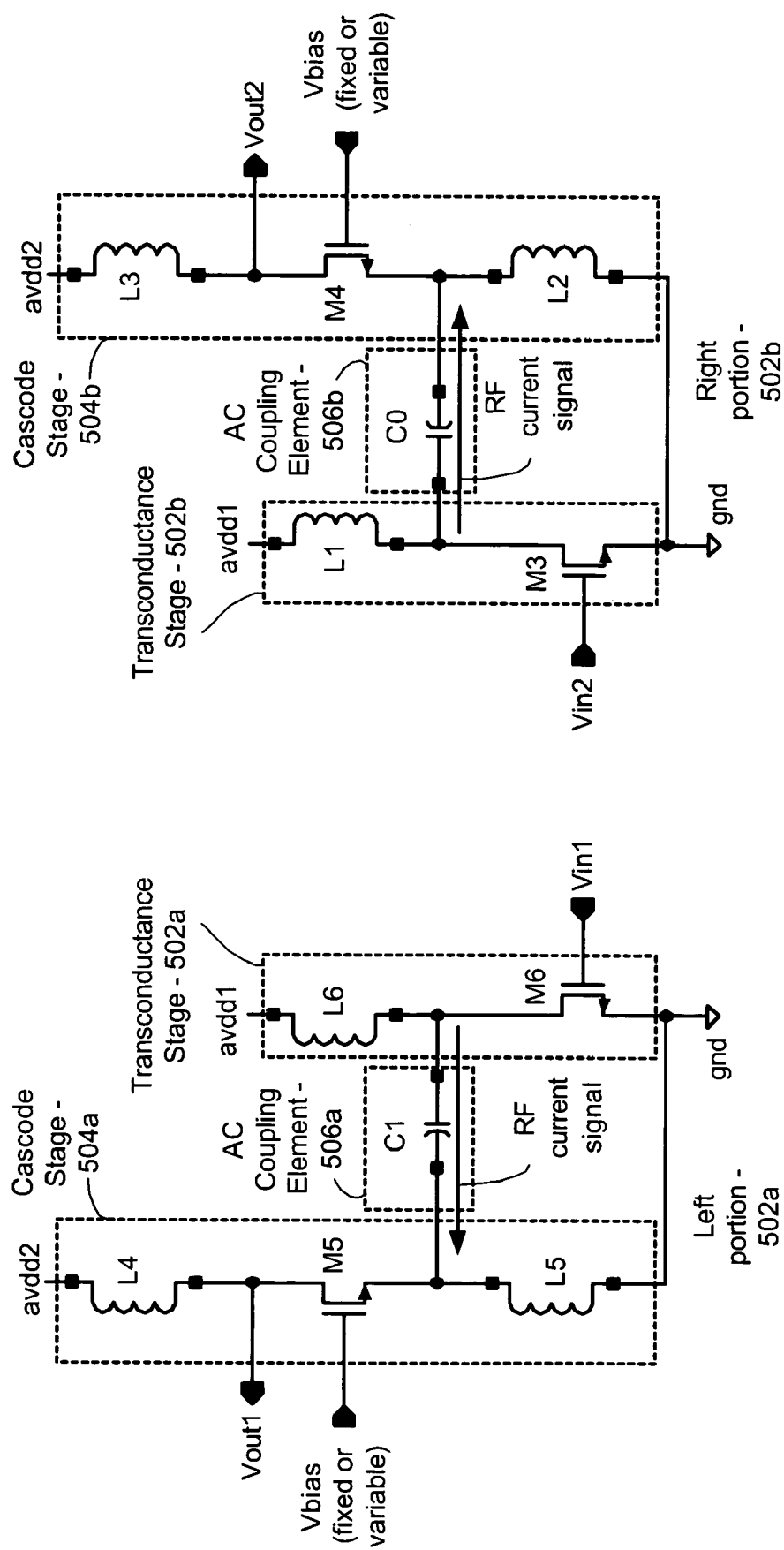
FIG. 5 is a schematic diagram illustrating a differential cascode RF power amplifier constructed according to the present invention.

FIG. 5 is a schematic diagram illustrating a differential cascode power amplifier 500 constructed according to the present invention. The differential power amplifier 500 includes a differential transconductance stage (504a and 504b), a differential cascode stage (502a and 502b), and a differential AC coupling element (506a and 506b). The differential transconductance stage (504a and 504b) is adapted to receive a differential input voltage signal (Vin1 and Vin2) and to produce a differential output current signal. The differential cascode stage (502a and 502b) is adapted to receive a differential input current signal and to produce a differential output voltage signal (Vout1 and Vout2). The differential AC coupling element (506a and 506b) couples between the differential transconductance stage (502a and 502b) and the differential cascode stage (504a and 504b) and operates to AC couple the differential output current signal of the differential transconductance stage (402a and 402b) as the differential input current signal of the differential cascode stage. In the illustrated embodiment, each AC coupling element 506a and 506b of the differential AC coupling element is a capacitor. In operation, the differential output voltage signal is amplified with respect to the differential input voltage signal.

Each portion of the differential transconductance stage 502a (502b) includes a series combination of a linear transconductance element M3 (M6) and a circuit element L1 (L6) coupled between a transconductance stage voltage supply avdd1 and a ground. In the illustrated embodiment, each linear transconductance element comprises a transistor M3 (M6) and each circuit element comprises an inductor L1 (L6). As illustrated, for each series combination, the inductor is in series with source and drain terminals of the corresponding transistor.

Each portion of the differential cascode stage 504a (504b) comprises a series combination of a first inductor L3 (L4), a transistor M4 (M5), and a second inductor L2 (L5) biased between a cascode stage voltage supply avdd2 and a ground. In this structure, for each portion of the differential cascode stage 504a (504b), gates of each transistor M4 (M5) are adapted to receive a controllable cascode bias voltage. Further, the differential transconductance stage 502a and 502b and the differential cascode stage 504 and 504b may be powered at differing voltage levels. Alternately, the differential transconductance stage 502a and 502b and the differential cascode stage 504 and 504b may be powered at a common voltage level. As illustrated inductors L2 (L5) and L3 (L4) are in series with source and drain terminals of transistor M4 (M5) such that the series combination of these elements couples between the cascode stage voltage supply avdd2 and ground.

Figure 6:
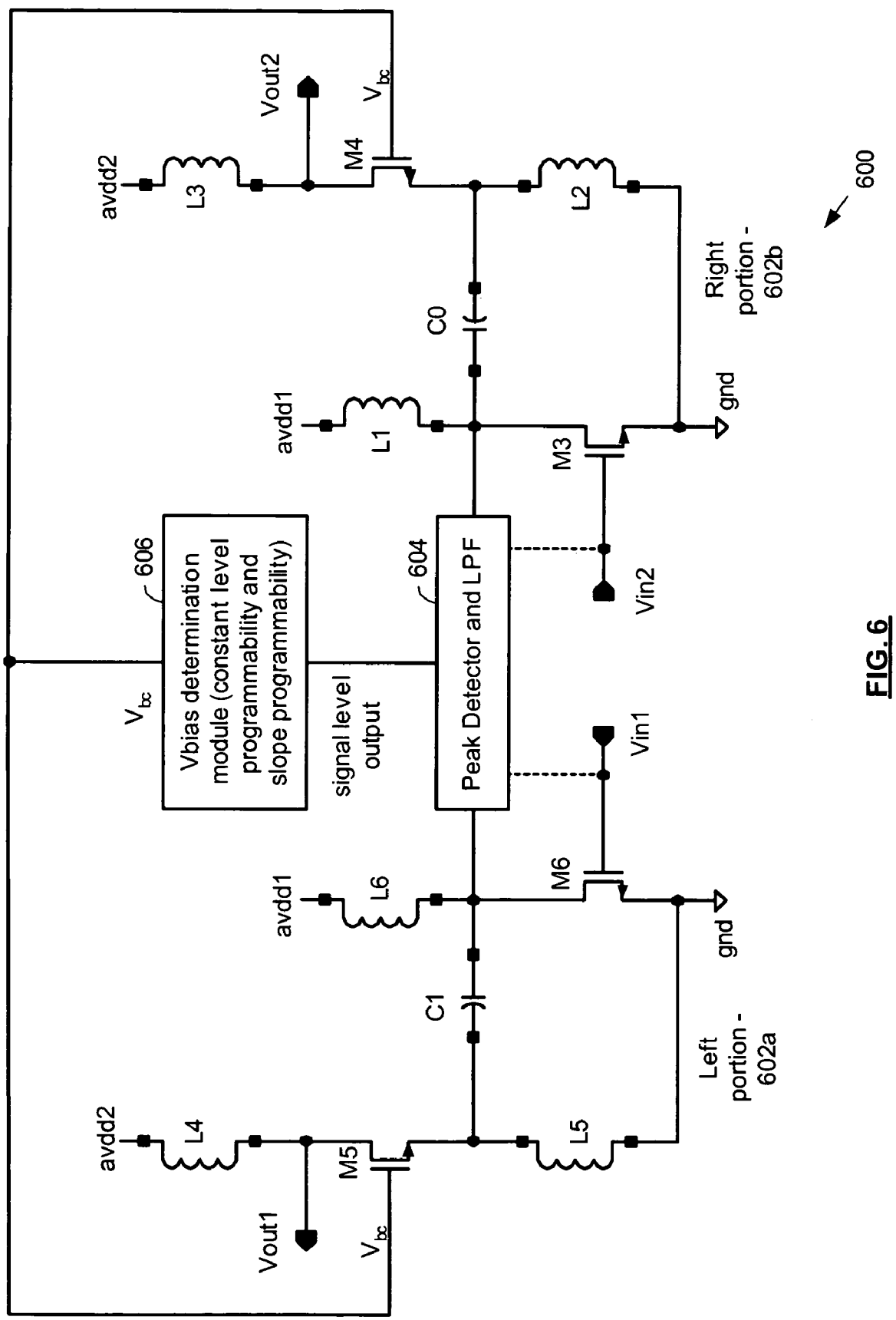
FIG. 6 is a schematic diagram illustrating a differential cascode RF power amplifier having variable cascode stage biasing constructed according to the present invention.

FIG. 6 is a schematic diagram illustrating a differential cascode power amplifier 600 having variable cascode stage biasing constructed according to the present invention. The differential cascode power amplifier 600 includes a left portion 602a and a right portion 602b, a peak detector and low pass filter circuit 604, and a Vbias determination module 606. The left portion 602a and right portion 602b are similar to or the same as corresponding components that are illustrated and discussed with reference to FIG. 5 but that have been modified according to the additional structure of FIG. 6.

The peak detector and low pass filter circuit 604 measures the signal level of an output voltage signal Vout1 and Vout2 produced by a differential transconductance stage of the differential power amplifier. Alternately, the peak detector and low pass filter circuit 604 measures the signal level of the input voltage signal Vin1 and Vin2. Based upon the level of the monitored signal, the peak detector and low pass filter circuit 604 produces a signal level output. The signal level output is representative of a modulated signal that is being operated upon by the power amplifier. The Vbias determination module 606 receives the signal level output and, based upon the signal level output, produces a $V_{bc}$ voltage that is employed to bias each side of the differential cascode stage of the differential cascode power amplifier 600. Together, the peak detector and low pass filter 604 and the $V_{bc}$ determination module 606 may be referred to as a modulation detection and bias determination module. The modulation detection and bias determination module may also be employed to produce a $V_{bc}$ voltage for a single ended cascode power amplifier, such as is shown in FIG. 4 where $V_{bc}$ is not fixed, which will be described further with reference to FIGS. 11 and 12.

Linear and amplitude dependent modulation schemes require very linear amplification of the incoming signal while also servicing a very large peak to average ratio. Meeting these requirements has previously required that the power amplifier be biased in the power hungry class A or AB region that only occasionally consumes a large bias current when the peaks of the modulation occur. The occurrence of these peaks is infrequent and is dependent on the statistics of the particular modulation used. However ignoring these peaks would result in a poor amplification quality and a resultant poor error-vector magnitude.

The scheme of FIG. 6 utilizes the peak detector and low pass filter circuit 604 to estimate the input signal level, which is representative of the modulation. The signal level is then filtered and applied to the Vbias determination module 606 as the signal level output for adjusting the fixed level of $V_{bc}$ as well as the signal dependent part of $V_{bc}$. The resultant $V_{bc}$ signal is then applied to the gates of the cascode transistors M4 and M5. This scheme can produce a dramatic reduction in power consumption of the amplifier when used with high-linearity high peak-to-average ratio modulation schemes. Such structure and operation can increase the P1 dB of the operation of the power amplifier 600 in some cases.

In other embodiments, an envelope detector or another circuit that corresponds to an employed modulation scheme may replace the peak detector and low pass filter 604. When the serviced device supports differing modulation schemes, the operation of the peak detector and low pass filter 604 and the Vbias determination module 606 may be tailored to the modulation scheme employed in order to properly bias the cascode stage.

As one of average skill in the art will appreciate, the term "substantially" or "approximately," as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

The invention claimed is:

1. A Radio Frequency (RF) power amplifier comprising:
   a differential transconductance stage adapted to receive a differential input RF voltage signal and to produce a differential output RF current signal;
   a differential cascode stage adapted to receive a differential input RF current signal and to produce a differential output RF voltage signal; and
   a differential AC coupling element coupled between the differential transconductance stage and the differential cascode stage and operable to AC couple the differential output RF current signal of the differential transconductance stage as the differential input RF current signal of the differential cascode stage.

2. The RF power amplifier of claim 1, wherein each portion of the differential trans conductance stage comprises a linear transconductance element and a circuit element that together couple between a transconductance stage voltage supply and a ground.

3. The RE power amplifier of claim 2, wherein of the differential transconductance stage:
   each linear transconductance element comprises a transistor; and
   each circuit element comprises an inductor.

4. The RF power amplifier of claim 1, wherein each portion of the differential cascode stage comprises a series combination of a first inductor, source and drain terminals of a transistor, and a second inductor biased between a cascode stage voltage supply and a ground.

5. The RF power amplifier of claim 4, wherein of the differential cascode stage, gates of each transistor are adapted to receive a controllable cascode bias voltage.

6. The RF power amplifier of claim 1, wherein the differential transconductance stage and the differential cascode stage are powered at differing voltage supply levels.

7. The RF power amplifier of claim 1, wherein the differential transconductance stage and the differential cascode stage are powered at a common voltage supply level.

8. The RF power amplifier of claim 1, wherein each portion of the differential AC coupling element comprises a capacitor.

9. A method for amplifying a differential Radio Frequency (RF) signal comprising:
   receiving a differential input RF voltage signal;
   producing a differential output RF current signal based upon the differential input RF voltage signal using a differential transconductance stage;
   AC coupling the differential output RF current signal as a differential input RF current signal to a differential cascode stage; and
   producing a differential output RF voltage signal based upon the differential input RF current signal using a differential cascode stage.

10. The method of claim 9, further comprising controlling a plurality of cascode bias voltages applied to the differential cascode stage.

11. The method of claim 9, further comprising powering the differential transconductance stage and the differential cascode stage at differing voltage supply levels.

12. The method of claim 9, further comprising powering the differential trans conductance stage and the differential cascode stage at a common voltage supply level.

* * * * *

UNITED STATES PATENT AND TRADEMARK OFFICE
CERTIFICATE OF CORRECTION

PATENT NO. : 7,200,370 B2  Page 1 of 1
APPLICATION NO. : 10/800237
DATED : April 3, 2007
INVENTOR(S) : Arya Behzad It is certified that error appears in the above-identified patent and that said Letters Patent is hereby corrected as shown below:

Column 10, line 16, in Claim 2: replace "trans conductance" with --transconductance--

Column 10, lines 35-36, in Claim 6: replace "cascade" with --cascode--

Column 10, line 54, in Claim 9: replace "cascade" with --cascode--

Column 10, line 60, in Claim 11: replace "cascade" with --cascode--

Column 10, line 62, in Claim 12: replace "trans conductance" with --transconductance--

Column 10, line 63, in Claim 12: replace "cascade" with --cascode--

Signed and Sealed this

Fifth Day of August, 2008

JON W. DUDAS
*Director of the United States Patent and Trademark Office*